(12) United States Patent
Matsuda et al.

(10) Patent No.: US 8,963,190 B2
(45) Date of Patent: Feb. 24, 2015

(54) LIGHT-EMITTING DEVICE AND LIGHTING APPARATUS

(75) Inventors: Ryotaro Matsuda, Yokosuka (JP); Kozo Ogawa, Yokosuka (JP); Makoto Sakai, Yokosuka (JP); Akiko Takahashi, Yokosuka (JP); Keiichi Shimizu, Yokosuka (JP); Kiyoshi Nishimura, Yokosuka (JP)

(73) Assignees: Toshiba Lighting & Technology Corporation, Kanagawa (JP); Kabushiki Kaisha Toshiba, Tokyo (JP)

( * ) Notice: Subject to any disclaimer, the term of this patent is extended or adjusted under 35 U.S.C. 154(b) by 208 days.

(21) Appl. No.: 13/392,107

(22) PCT Filed: Aug. 25, 2010

(86) PCT No.: PCT/JP2010/064396
§ 371 (c)(1),
(2), (4) Date: Feb. 24, 2012

(87) PCT Pub. No.: WO2011/024861
PCT Pub. Date: Mar. 3, 2011

(65) Prior Publication Data
US 2012/0161194 A1    Jun. 28, 2012

(30) Foreign Application Priority Data

Aug. 25, 2009  (JP) ................................ 2009-194853
Oct. 23, 2009  (JP) ................................ 2009-244987

(51) Int. Cl.
*H01L 33/64* (2010.01)
*F21V 3/04* (2006.01)
(Continued)

(52) U.S. Cl.
CPC ... *F21V 3/04* (2013.01); *F21S 8/04* (2013.01); *F21V 29/004* (2013.01); *F21Y 2101/02* (2013.01); *F21Y 2105/001* (2013.01)
USPC ...................... 257/99; 257/E33.075

(58) Field of Classification Search
USPC ............................................. 257/99, E33.075
See application file for complete search history.

(56) References Cited

U.S. PATENT DOCUMENTS

| 2003/0034731 A1* | 2/2003 | Masahiro et al. ............. 313/567 |
| 2006/0102917 A1* | 5/2006 | Oyama et al. .................. 257/99 |
| 2009/0101897 A1* | 4/2009 | Murphy et al. ................. 257/48 |

FOREIGN PATENT DOCUMENTS

| JP | 2002-304903 | 10/2002 |
| JP | 2004-235652 | 8/2004 |

(Continued)

OTHER PUBLICATIONS

International Search Report issued in PCT/JP2010/064396 on Oct. 12, 2010.

(Continued)

*Primary Examiner* — Zandra Smith
*Assistant Examiner* — Lawrence Tynes, Jr.
(74) *Attorney, Agent, or Firm* — DLA Piper LLP (US)

(57) ABSTRACT

A light-emitting device includes a substrate having a front surface on which a semiconductor light-emitting element is mounted. A front cover is provided which thermally contacts the front surface of the substrate at a periphery of the semiconductor light-emitting element and is disposed on a front side of the substrate. A heat conduction path is formed along which heat generated by the semiconductor light-emitting element is conducted in order of the substrate and the front cover and the heat is radiated from a front surface of the front cover, so that a heat radiation property from a front surface of the light-emitting device is improved.

7 Claims, 17 Drawing Sheets

(51) Int. Cl.
  *F21S 8/04* (2006.01)
  *F21V 29/00* (2006.01)
  *F21Y 101/02* (2006.01)
  *F21Y 105/00* (2006.01)

(56) References Cited

FOREIGN PATENT DOCUMENTS

| JP | 335880 | | 11/2004 | |
| JP | 2008130823 | * | 5/2008 | ............ H01L 33/00 |
| JP | 2008-130823 | | 6/2008 | |
| JP | 2009-054979 | | 3/2009 | |
| JP | 2009-099336 | | 5/2009 | |

OTHER PUBLICATIONS

English Language Abstract of JP 2002-304903 published on Oct. 18, 2002.
English Language Translation of JP 2002-304903 published on Oct. 18, 2002.
English Laguage Abstract of JP 2009-099336 published May 7, 2009.
English Laguage Translation of JP 2009-099336 published May 7, 2009.
English Language Abstract of JP 2004-235652 published Aug. 19, 2004.
English Language Translation of JP 2004-235652 published Aug. 19, 2004.
English Language Abstract of JP 2004-335880 published Nov. 25, 2004.
English Language Translation of JP 2004-335880 published Nov. 25, 2004.
English Language Abstract of JP 2008-130823 published Jun. 5, 2008.
English Language Translation of JP 2008-130823 published Jun. 5, 2008.
English Language Abstract of JP 2009-054989 published Mar. 12, 2009.
English Language Translation of JP 2009-054989 published Mar. 12, 2009.

* cited by examiner

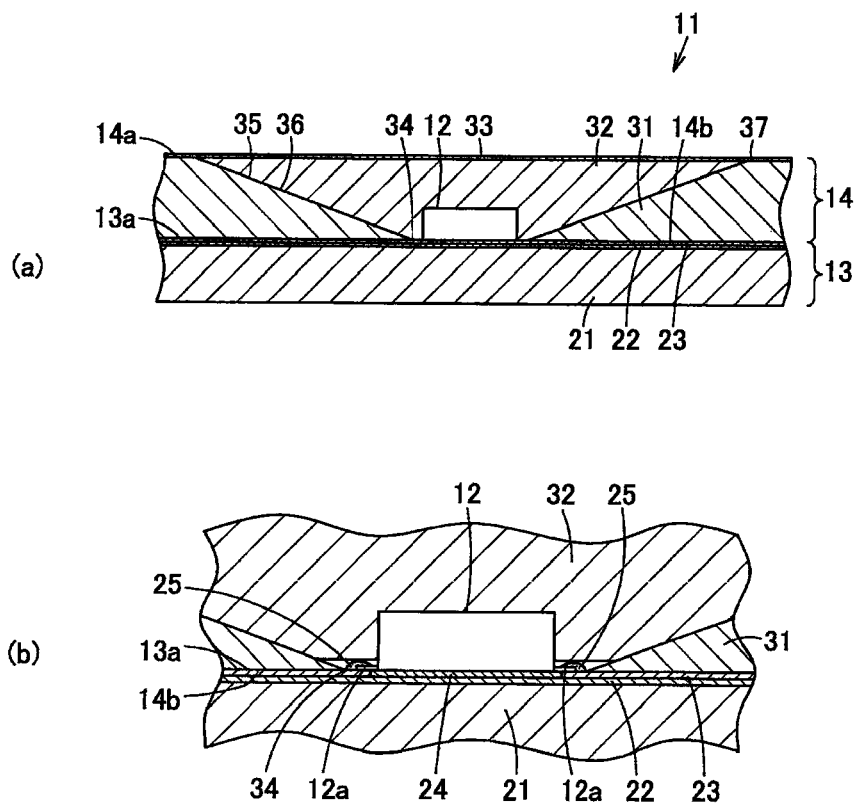
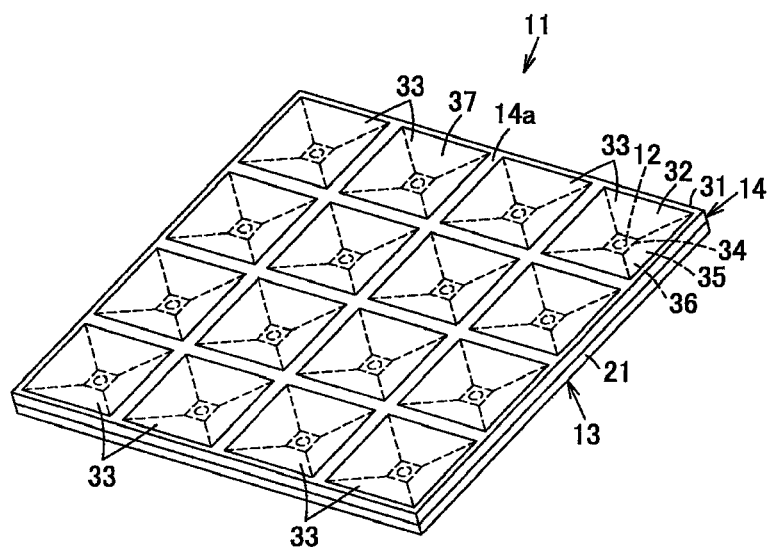
FIG. 1
FIG. 2

| THICKNESS OF REFLECTING MEMBER | OPENING / CONTACT | COVER THICKNESS | REFLECTING MEMBER + COVER THICKNESS | LED HIGHEST TEMPERATURE | |
|---|---|---|---|---|---|
| 3 | 36 | 3 | 6 | 80.5272 | |
| 4 | 65 | 2 | 6 | 80.6421 | |
| 5.5 | 180 | 1 | 6.5 | 82.1093 | |
| 5 | 124 | 1 | 6 | 82.1133 | |
| 3 | 36 | 2 | 5 | 82.2226 | |
| 4 | 65 | 1 | 5 | 82.2776 | |
| 4 | 65 | 0.5 | 4.5 | 83.0613 | |
| 3 | 36 | 1 | 4 | 83.2409 | |
| 3 | 36 | 0.5 | 3.5 | 83.3987 | ↑ OK |
| 5 | 124 | 2 | 7 | 86.9186 | ↓ NG |
| 5 | 124 | 0.5 | 5.5 | 86.9624 | |
| 5.5 | 180 | 0.5 | 6 | 86.9717 | |
| 5.5 | 180 | 2 | 7.5 | 87.0019 | |
| 4 | 65 | 3 | 7 | 89.9185 | |
| 5 | 124 | 3 | 8 | 90.5093 | |
| 5.5 | 180 | 3 | 8.5 | 90.5128 | |

FIG. 7

LIGHT-EMITTING DEVICE AND LIGHTING APPARATUS

FIELD

Embodiments described herein relate generally to a light-emitting device using a semiconductor light-emitting element and a lighting apparatus using the light-emitting device.

BACKGROUND

Some light-emitting devices using, for example, an LED element as a semiconductor light-emitting element include a substrate having a front surface on which a wiring pattern is formed, plural LED elements mounted on the wiring pattern of the front surface of the substrate, and a lens that is arranged on the front surface of the substrate and controls the light emitted from the respective LED elements.

In these light-emitting devices, generally, heat generated by the LED elements is conducted to the substrate and is radiated from the back surface of the substrate to lighting equipment on which the substrate is mounted. Therefore, reduction of the light output of the LED element and reduction of the life of the LED element are suppressed.

In ceiling-mounted light-emitting devices in which heat is radiated from the back surface of the substrate, although heat is conducted from the back surface of the substrate to a top plate of an equipment body, a relatively non-conductive material such as gypsum board or wood may be used for the ceiling member to which the top plate of the equipment body is attached. Thus, a required heat radiation property may not be realized by the top plate of the equipment body. This is often addressed with a countermeasure such as to a gap between the top plate of the equipment body and the ceiling member, which increases the thickness of the lighting equipment.

In some light-emitting devices, the area of a wiring pattern formed on the front surface of a substrate is wide, heat generated by LED elements is conducted to the wiring pattern having the wide area, and the heat is radiated to the air from the wiring pattern, so that adequate heat radiation from the front surface of the substrate is realized.

In some light-emitting devices a substrate on which plural LED elements are mounted is arranged inside a housing, plural spacers are provided between the housing and the front surface of the substrate, and the substrate is fixed to the housing by screws inserted in the respective spacers. In this light-emitting device, heat generated by the LED elements is conducted to the substrate, is conducted from the substrate to the housing through the spacers and the screws, and is radiated from the housing.

CITATION LIST

Patent Literature

[PTL 1] JP-A-2004-335880
[PTL 2] JP-A-2008-130823

SUMMARY OF INVENTION

Technical Problem

However, in the light-emitting device having the structure in which heat is radiated to the air from the wiring pattern on the front surface of the substrate, the lens and the like are arranged on the front surface side of the substrate, and sufficient air convection can not be obtained at the front surface side of the substrate. Therefore, a sufficient heat radiation property may not be realized.

In the light-emitting device in which heat is radiated by heat conduction from the front surface of the substrate to the housing, heat is conducted from the front surface of the substrate to the housing only through the spacers and the screws, and an air layer as a heat insulating layer is provided between the front surface of the substrate and the housing, except at the spacers and the screws. Therefore, sufficient heat conductivity from the front surface of the substrate to the housing can not be obtained, and a sufficient heat radiation property from the front surface of the light-emitting device may not be realized.

The invention is made in view of such circumstances, and an object thereof is to provide a light-emitting device and a lighting apparatus enabling sufficient heat radiation from a front surface.

Solution to Problem

In general, according to one embodiment, a light-emitting device includes a substrate having a front surface on which a semiconductor light-emitting element is mounted. A front cover is provided which thermally contacts the front surface of the substrate at a periphery of the semiconductor light-emitting element and is disposed on a front side of the substrate. A heat conduction path is formed along which heat generated by the semiconductor light-emitting element is conducted in order of the substrate and the front cover and the heat is radiated from a front surface of the front cover, so that a heat radiation property from the front surface of the light-emitting device is improved.

BRIEF DESCRIPTION OF THE DRAWINGS

FIGS. 1(a) and 1(b) show a first embodiment, in which FIG. 1(a) is a sectional view of a part of a light-emitting device, and FIG. 1(b) is an enlarged sectional view of a part of the light-emitting device.

FIG. 2 is a perspective view of the light-emitting device.

FIGS. 5(a) and 5(b) show a temperature distribution in which semiconductor light-emitting elements of the light-emitting device are lighted and temperature is measured, in which FIG. 5(a) is a temperature distribution view of a case where an air layer exists in a front cover, and FIG. 5(b) is a temperature distribution view of a case where an air layer does not exist in the front cover.

FIG. 7 is a table showing a summary of results obtained by measuring temperature of a semiconductor light-emitting element while changing conditions of a front cover of the light-emitting device.

DETAILED DESCRIPTION

Figure 3:
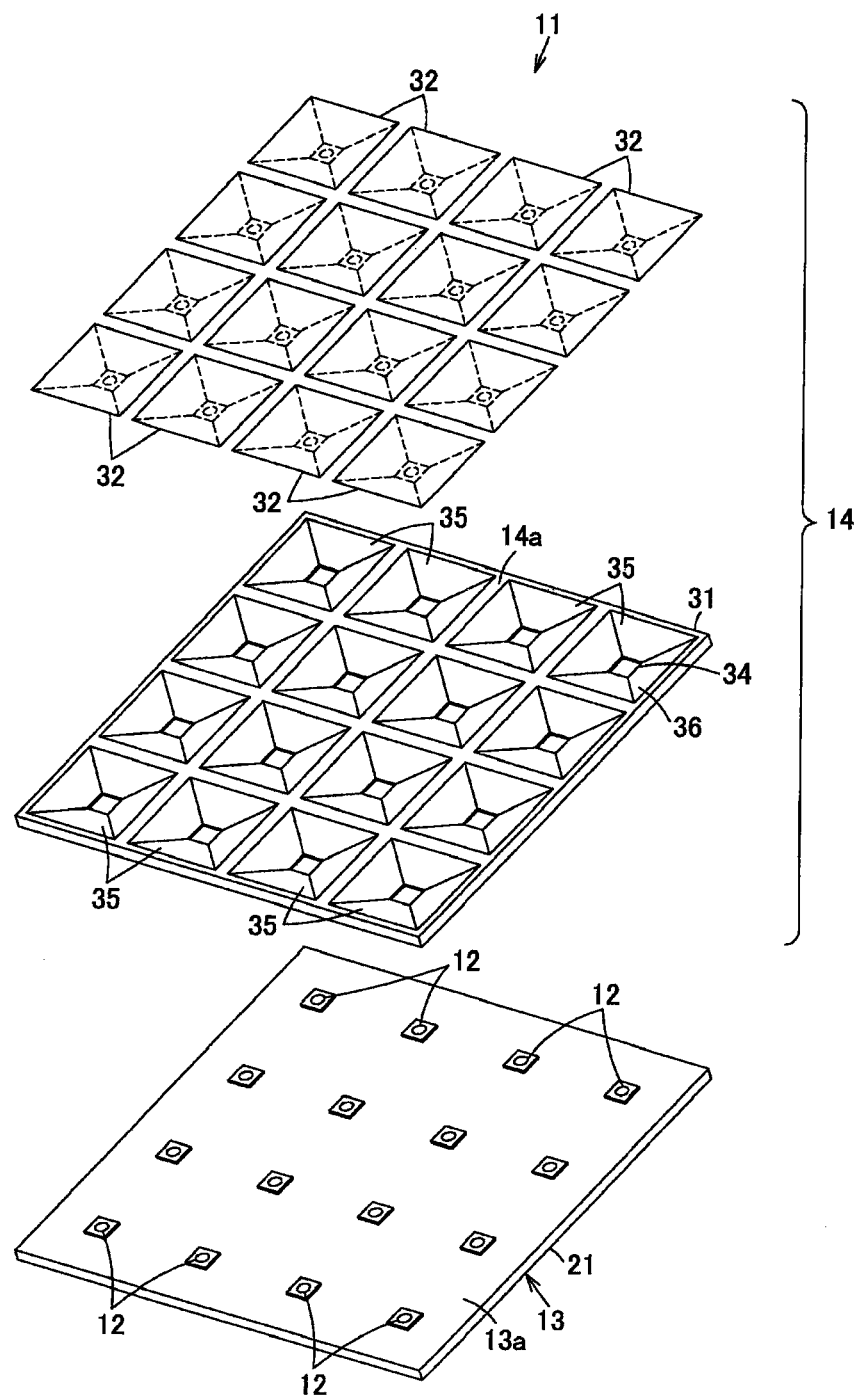
FIG. 3 is a perspective view of an exploded state of the light-emitting device.

Hereinafter, a first embodiment will be described with reference to FIG. 1 to FIG. 3.

A light-emitting device 11 includes a substrate 13 including a front surface 13a as a mounting surface on which plural semiconductor light-emitting elements 12 are mounted, and a front cover 14 disposed so as to cover the front surface 13a of the substrate 13.

The semiconductor light-emitting element 12 is, for example, an LED element, and an SMD (Surface Mount Device) type is used in which a light-emitting element includes a terminal mounted with an LED chip. That is, the semiconductor light-emitting element 12 includes a square base having a terminal 12a as a lead terminal, an LED chip that is mounted on the base, is electrically connected to the terminal 12a and emits blue light, a reflector that houses the LED chip and reflects the light emitted by the LED chip forward, and a phosphor layer as a transparent resin that covers the LED chip in the reflector and is mixed with a phosphor which is excited by the blue light emitted by the LED chip and mainly emits yellow light. The semiconductor light-emitting element 12 is constructed such that the LED chip is a primary light source, the front surface of the phosphor layer as a planar secondary light source is a light-emitting surface, and white light is emitted from the light-emitting surface.

The substrate 13 includes a substrate body 21 made of a metal, such as aluminum, excellent in heat conductivity or a non-metal material, and formed into a square shape. As the non-metal material of the substrate body 21, for example, ceramics is used, or a glass epoxy substrate, a paper phenol substrate or the like is used, and a horizontally anisotropic heat conducting substrate may be used. An insulating layer 22 is formed on the front surface of the substrate body 21, and a wiring pattern 23 as a wiring layer for connecting the plural semiconductor light-emitting elements 12 in series is formed on the insulating layer 22. Further, a resist layer 24 flush with the wiring pattern 23 is formed in an area where the wiring layer pattern 23 is not formed. The wiring pattern 23 is formed of a copper foil or the like excellent in heat conductivity. Since the heat conduction efficiency from the semiconductor light-emitting element 12 to the front cover 14 is high, the non-metal material can be used as the material of the substrate body 21.

The plural semiconductor light-emitting elements 12 are arranged on the wiring pattern 23 of the substrate 13 at regular intervals in horizontal and vertical directions of the substrate 13, and the terminal 12a of each of the semiconductor light-emitting elements 12 is electrically connected to the wiring pattern 23 by a solder 25 and is mounted.

Besides, a back surface 14b of the front cover 14 is formed as a contact surface that thermally contacts the front surface 13a of the substrate 13 at the periphery of the semiconductor light-emitting element 12. That the front cover 14 thermally contacts the front surface of the substrate 13 means a state where surface contact is performed without forming an intervening air layer or the like, and high heat conductivity is secured. Incidentally, although the back surface 14b of the front cover 14 preferably contacts the front surface 13a of the substrate 13 so as to surround the periphery of the semiconductor light-emitting element 12, if the heat conductivity is secured, a mode of contact with a part of the periphery may be adopted.

The front cover 14 includes a reflecting member 31 as a first cover member and a translucent member 32 as a second cover member, and plural light emitting parts 33 are formed correspondingly to positions of the respective semiconductor light-emitting elements 12 mounted on the substrate 13.

The reflecting member 31 is integrally molded into a square shape similarly to the substrate 13. Square opening parts 34 in which the respective semiconductor light-emitting elements 12 are inserted and arranged are formed correspondingly to the positions of the respective semiconductor light-emitting elements 12 mounted on the substrate 13, that is, at the respective light emitting parts 33. A quadrangular-pyramid-shaped recess 35 is formed to expand and open forward from each of the opening parts 34. The inner surface of the recess 35 is formed as a reflecting surface 36 to reflect the light emitted by the semiconductor light-emitting element 12 forward. The back surface of the reflecting member 31 is brought into surface contact with the substrate 13 without forming an air layer by using a heat conduction layer (similar to a heat conduction layer 52 described in a sixth embodiment) of, for example, epoxy adhesive and close contact is realized, so that the reflecting member is bonded and fixed in a thermal contact state. Incidentally, the back surface of the reflecting member 31 may be brought into surface contact with the front surface 13a of the substrate 13 without forming an air layer by using mechanical means such as screwing and close contact may be realized, so that the reflecting member is fixed in the thermal contact state.

The translucent member 32 is formed by filling each of the recesses 35 of the reflecting members 31 fixed to the substrate 13 with a transparent resin, and is brought into direct surface contact with the substrate 13, the semiconductor light-emitting element 12 and the inside of the recess 35 of the reflecting member 31 without forming an air layer and close contact is realized, so that thermal contact is realized. A front surface of the translucent member 32 is formed as a light emitting surface from which the light emitted by the semiconductor light-emitting element 12 outgoes.

The reflecting member 31 and the translucent member 32 are formed of transparent resins that have a high heat conductivity of about 1 to 5 W/mk and a transmittance of 90% or more for light having a wavelength of, for example, 400 to 800 nm, and are different in refractive index. For example, the reflecting member 31 is formed of a high refractive index resin having high heat conductivity, such as epoxy resin kneaded with carbon, acryl resin, polycarbonate or polyphenylene sulfide (PPS). Besides, the translucent member 32 is formed of a low refractive index resin such as silicone resin. Incidentally, the heat conductivity of the air layer is about 0.01 to 0.02 W/mk, and the heat conductivity of common resin is about 0.2 W/mk.

The reflecting surface 36 to reflect light is formed at the interface between the reflecting member 31 and the translucent member 32 that are different in refractive index. The reflective index is set by setting the difference in refractive index, and various light distribution controls can be performed without changing the shape.

Incidentally, although the reflecting member 31 preferably has a high heat conductivity, this is not a necessary condition. This is because, with respect to the reflecting member 31, to secure the size of the contact area with the front surface 13a of the substrate 13 and the heat radiation area exposed forward is a more important design element in raising the heat radiation property. Further, the reflecting member 31 may be transparent or opaque, or a metal material may be used if an insulating layer intervenes between the reflecting member and the front surface 13a of the substrate 13.

Besides, a nano-fine particle coating 37 is applied to a front surface 14a of the front cover 14. The nano-fine particle coating 37 has high heat conductivity and heat radiation property, is made of inorganic fine particles of, for example, $Al_2O_3$ or $TiO_2$, which are fine particles having an average particle diameter of 30 to 50 nm and preferably having a particle distribution with a peak of about 40 nm, and a film thickness thereof is 100 to 200 nm. Further, the nano-fine particle coating 37 has a light diffusion property, and can diffuse the light emitted from the semiconductor light-emitting element 12. Incidentally, if the front cover 14 has high heat radiation function, the nano-fine particle coating 37 may be omitted.

Next, the operation of the light-emitting device 11 will be described.

Power is supplied to the respective semiconductor light-emitting elements 12 through the wiring pattern 23 of the substrate 13, so that the respective semiconductor light-emitting elements 12 emit white light, and the light passes through the translucent member 32 of the front cover 14, and is emitted forward from the front surface 14a.

Part of the heat generated by the respective lighted semiconductor light-emitting elements 12 is conducted to the substrate 13 and is conducted from the substrate 13 to the reflecting member 31 of the front cover 14. Besides, part of the heat is conducted to the translucent member 32 of the front cover 14, and the heat is radiated into the front air in the same direction as the light irradiation direction from the front surface 14a of the front cover 14 as the front surface of the reflecting member 31 and the translucent member 32.

At this time, the heat generated by the respective lighted semiconductor light-emitting elements 12 is mainly efficiently conducted to the substrate 13 on which the semiconductor light-emitting elements 12 are mounted, and is particularly conducted very efficiently from the terminals 12a, which are excellent in heat conductivity, of the semiconductor light-emitting elements 12 to the wiring pattern 23 of the substrate 13. The heat conducted to the substrate 13 extends along the substrate 13, is efficiently conducted from the front surface 13a of the substrate 13, which is formed to be flush and has a relatively large area, to the front cover 14 which is in close contact by surface contact without an air layer so that thermal contact is realized, and the heat is radiated to the air from the front surface 14a of the front cover 14, which has a large area and is exposed forward.

As stated above, in the light-emitting device 11, since the front cover 14 disposed on the front surface 13a of the substrate 13 thermally contacts the front surface 13a of the substrate 13 at the periphery of the semiconductor light-emitting element 12, a heat conduction path is formed such that the heat generated by the semiconductor light-emitting element 12 is efficiently conducted in order of the substrate 13 and the front cover 14 and is radiated from the front surface 14a of the front cover 14, and the heat radiation property from the front surface of the light-emitting device 11 can be improved.

Especially, since the front cover 14 is in direct surface contact with the front surface 13a of the substrate 13 and the semiconductor light-emitting element 12 and close contact is realized, an air layer does not intervene between these, the heat conduction efficiency from the substrate 13 and the semiconductor light-emitting element 12 to the front cover 14 is high, and the heat radiation property from the front surface of the light-emitting device 11 can be improved.

Further, since the front cover 14 thermally contacts the wiring pattern 23 formed on the front surface 13a of the substrate 13, the heat of the semiconductor light-emitting element 12 is conducted to the front cover 14 through the terminal 12a and through the wiring pattern 23 where heat is efficiently conducted. Accordingly, the heat conduction efficiency is high, and the heat radiation property from the front surface of the light-emitting device 11 can be improved. Incidentally, since the resist layer 24 is further formed on the front surface of the wiring pattern 23, the heat is conducted to the front cover 14 through the resist layer 24.

Besides, since the nano-fine particle coating 37 having high heat conductivity and heat radiation property is applied to the front surface 14a of the front cover 14, the heat radiation property from the front surface of the light-emitting device 11 can be improved.

The light-emitting device 11 constructed as stated above can be applied to a lighting apparatus, for example, a ceiling mounting lighting equipment. When the light-emitting device is applied to the ceiling mounting lighting equipment, the back surface of the light-emitting device 11 is attached to the lower surface of a top plate of an apparatus body attached to a ceiling member. However, even if a material hard to conduct heat, such as gypsum board or wood, is used as the ceiling member to which the top plate of the apparatus body is attached, and a sufficient heat radiation property can not be secured by the top plate of the apparatus body, a heat radiation property sufficient to suppress reduction of light output of the semiconductor light-emitting element 12 and reduction of life thereof can be secured by the front surface of the light-emitting device 11. Accordingly, countermeasures such as to form a gap between the top plate of the apparatus body and the ceiling member are not required, and the lighting apparatus can be made thin. Incidentally, a specific example of the lighting apparatus will be described later.

Figure 4:
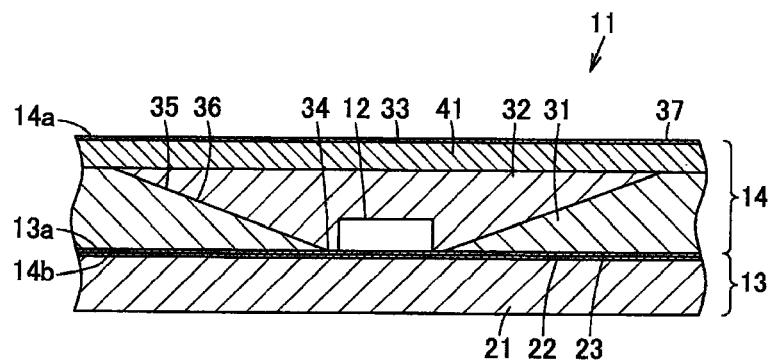
FIG. 4 shows a second embodiment and is a sectional view of a part of a light-emitting device.
Figure 5:
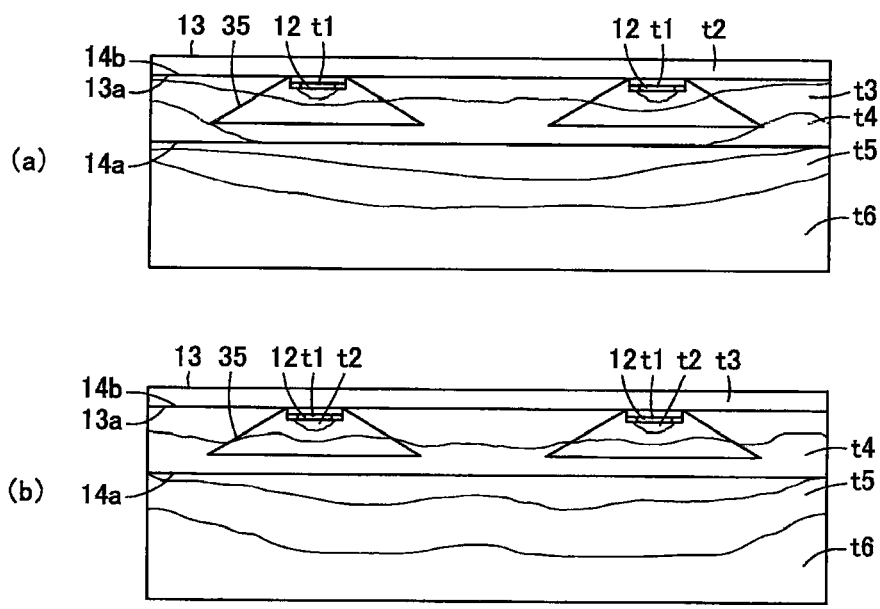

FIG. 4 and FIGS. 5(a) and 5(b) show a second embodiment. Incidentally, the same component as that of the foregoing embodiment is denoted by the same reference numeral and its description is omitted.

As shown in FIG. 4, a light-emitting device 11 is such that in the light-emitting device 11 of the first embodiment shown in FIG. 1 to FIG. 3, the translucent member 32 of the front cover 14 is formed of soft silicone resin, and for the purpose of protecting the translucent member 32, the front cover 14 includes a transparent cover 41 to integrally cover the whole of the reflecting member 31 and the translucent member 32. The cover 41 is formed of a transparent resin having a transmittance of 90% or more for light having a wavelength of, for example, 400 to 800 nm, and is brought into surface contact with the front surface of the reflecting member 31 and the translucent member 32 without forming an air layer and close contact is realized, so that the cover is attached thereto in a thermal contact state. A nano-fine particle coating 37 is formed on the front surface of the cover 41 as the front surface 14a of the front cover 14.

Besides, FIGS. 5(a) and 5(b) are views showing temperature distribution which is obtained by lighting the semiconductor light-emitting elements 12 of the light-emitting device 11 and measuring the temperature. FIG. 5(a) shows a case where an air layer exists in the front cover 14, that is, the translucent member 32 is not formed in the recess 35 of the reflecting member 31 of the front cover 14, and the air layer exists in the front cover 14 and in a space surrounded by the substrate 13, the recess 35 of the reflecting member 31 and the cover 41. FIG. 5(b) shows a case where an air layer does not exist in the front cover 14, that is, the translucent member 32 is formed in the recess 35 of the reflecting member 31 of the front cover 14. The temperature distribution is represented in contour, temperature t1 is highest, and temperature becomes low in order of t1, t2, t3, t4, t5 and t6. Besides, a heat insulating material is disposed at the back surface of the substrate 13 and measurement is performed.

As shown in FIG. 5(a), if the air layer exists in the front cover 14, the temperature of the substrate 13 becomes high, and the highest temperature at that time is 80.64° C. This is because, since the air layer exists in the front cover 14, the heat capacity of the front cover 14 capable of heat conduction from the substrate 13 is decreased, and heat radiation from the front surface 14a of the front cover 14 is reduced.

As shown in FIG. 5(b), if the air layer does not exist in the front cover 14, the temperature of the substrate 13 becomes lower than that of the case where the air layer exists as shown in FIG. 5(a), and the highest temperature at that time is 69.69° C. This is because, since the air layer does not exist in the front cover 14, the heat capacity of the front cover 14 capable of heat conduction from the substrate 13 is increased, and the heat radiation property from the front surface 14a of the front cover 14 is improved.

As stated above, the front cover 14 is brought into surface contact with the front surface 13a of the substrate 13 without an air layer and close contact is realized, so that thermal contact is realized, and the air layer does not exist in the front cover 14. Accordingly, the heat radiation property from the front surface of the light-emitting device 11 can be improved.

Figure 6:
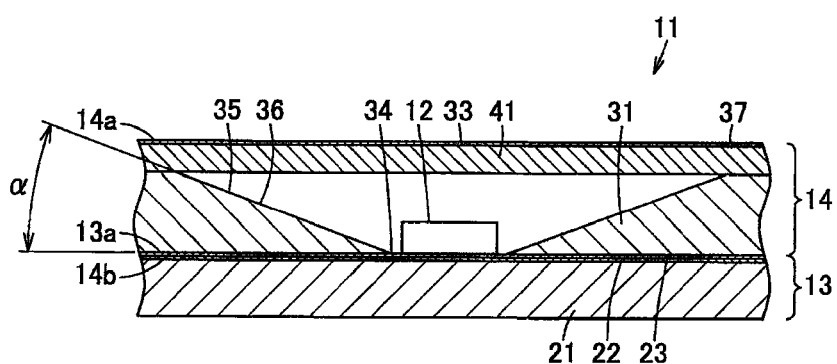
FIG. 6 shows a third embodiment and is a sectional view of a part of a light-emitting device.

FIG. 6 and FIG. 7 show a third embodiment. Incidentally, the same component as that of the foregoing respective embodiments is denoted by the same reference numeral and its description is omitted.

As shown in FIG. 6, a light-emitting device 11 is such that in the light-emitting device 11 of the second embodiment shown in FIG. 4, the translucent member 32 is not formed in the recess 35 of the reflecting member 31 of the front cover 14 and an air layer exists, that is, the air layer exists in the front cover 14 and in a space surrounded by the substrate 13, the recess 35 of the reflecting member 31, and the cover 41.

The reflecting member 31 of the front cover 14 is formed of such a material that the reflectance of the reflecting surface 36 is 80% or more, and a light shielding angle α of the reflecting surface 36 with respect to the light emitting surface of the semiconductor light-emitting element 12, which is for preventing glare, is within a range of 20 to 30°, and more preferably within a range of 25 to 30°.

The ratio of an area (area of a contact portion between the reflecting member 31 and the cover 41) of the front surface of the reflecting member 31 except the portion of the recess 35 to an area of the recess 35 of the reflecting member 31 at an opening end is regulated to be within a range of 1:1 to 2:1, so that even if the air layer exists in the front cover 14, heat radiation property from the front surface of the light-emitting device 11 can be improved.

FIG. 7 is a table showing a summary of results obtained by measuring temperature of the semiconductor light-emitting element 12 (LED chip) while changing conditions of the front cover 14 of the light-emitting device 11.

The conditions include the thickness of the reflecting member 31, the area ratio of the open area of the reflecting member 31 (area of the recess 35 of the reflecting member 31 at the open end)/contact area (area of the contact portion between the reflecting member 31 and the cover 41), the thickness of the cover 41, and the total thickness of the reflecting member 31 and the cover 41. These conditions are changed, and the highest temperature of the semiconductor light-emitting element 12 (LED chip) is measured.

In view of the life and light emission efficiency, the temperature of the semiconductor light-emitting element 12 (LED chip) is preferably 85° C. or less. Accordingly, if the highest temperature of the semiconductor light-emitting element 12 (LED chip) is 85° C. or less, the element is appropriate (OK), and if the temperature exceeds 85° C., the element is inappropriate (NG).

As a result, the area ratio of the open area of the reflecting member 31 (area of the recess 35 of the reflecting member 31 at the open end)/contact area (area of the contact portion between the reflecting member 31 and the cover 41) is preferably within a range of 35 to 124, and the total thickness of the reflecting member 31 and the cover 41 is preferably 6 mm or less.

With respect to the area ratio of the open area of the reflecting member 31 (area of the recess 35 of the reflecting member 31 at the open end)/contact area (area of the contact portion between the reflecting member 31 and the cover 41), if the area ratio of the recess 35 of the reflecting member 31 at the open end becomes large, the heat conduction efficiency from the reflecting member 31 to the cover 41 is reduced, or the desired light shielding angle α can not be obtained. If the area ratio of the recess 35 of the reflecting member 31 at the open end becomes small, the desired light shielding angle α can not be obtained. Thus, the area ratio of the open area of the reflecting member 31 (area of the recess 35 of the reflecting member 31 at the open end)/contact area (area of the contact portion between the reflecting member 31 and the cover 41) is preferably within the range of 35 to 124.

With respect to the total thickness of the reflecting member 31 and the cover 41, if the total thickness becomes excessively thick, the distance of the heat conduction path from the substrate 13 to the front surface of the cover 41 becomes long and heat conduction can not be efficiently performed. Accordingly, the total thickness is preferably 6 mm or less. However, if the total thickness becomes smaller than 4 mm, the heat capacity becomes small, and the heat conduction efficiency from the substrate 13 to the reflecting member 31 is reduced. Thus, the total thickness of the reflecting member 31 and the cover 41 is preferably within the range of 4 to 6 mm.

Figure 8:
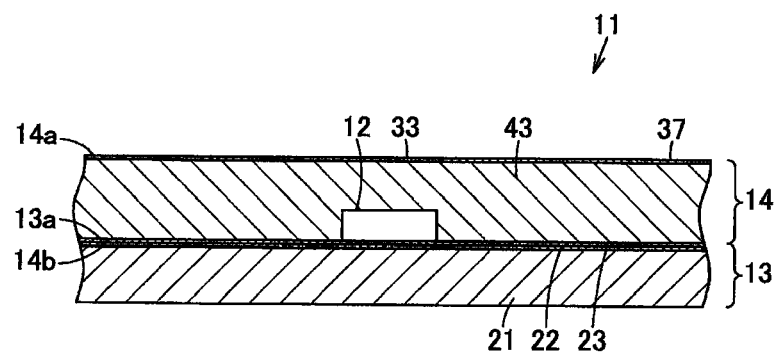
FIG. 8 shows a fourth embodiment and is a sectional view of a part of a light-emitting device.

FIG. 8 shows a fourth embodiment. Incidentally, the same component as that of the foregoing respective embodiments is denoted by the same reference numeral and its description is omitted.

A front cover 14 includes one cover 43, and the cover 43 is brought into surface contact, without forming an air layer, with a front surface 13*a* of a substrate 13 on which a semiconductor light-emitting element 12 is mounted and close contact is realized, so that a thermal contact state is realized. The cover 43 can be formed by thickly applying a transparent resin so that the whole front surface 13*a* of the substrate 13 on which the semiconductor light-emitting element 12 is mounted is molded. Also in this case, a nano-fine particle coating 37 may be formed on the front surface of the cover 43.

Incidentally, in the case where the semiconductor light-emitting element 12 is an LED element, not only an SMD (Surface Mount Device) type, but also a COB (Chip On Board) type may be adopted in which plural LED chips are directly mounted on a wiring pattern 23 of the front surface 13*a* of the substrate 13, and a phosphor layer formed of a transparent resin mixed with a phosphor is formed to cover the LED chips.

If the semiconductor light-emitting element 12 is of the COB type, the phosphor layer is formed by thickly applying the transparent resin containing phosphor to the front surface 13*a* of the substrate 13 on which the plural LED chips are mounted, or the cover 43 is formed such that each of the LED chips mounted on the substrate 13 is covered with a phosphor layer in a dome shape, and the transparent resin is thickly applied to the front surface 13*a* of the substrate 13.

Figure 9:
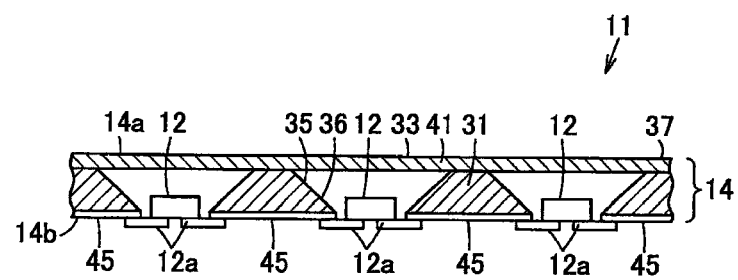
FIG. 9 shows a fifth embodiment and is a sectional view of a part of a light-emitting device.

FIG. 9 shows a fifth embodiment. Incidentally, the same component as that of the foregoing respective embodiments is denoted by the same reference numeral and its description is omitted.

A front cover 14 includes a reflecting member 31 and a cover 41 arranged on a front surface of the reflecting member 31, and a translucent member 32 is not formed in a recess 35 of the reflecting member 31. A wiring pattern 45 for connecting plural semiconductor light-emitting elements 12 in series is formed on a back surface of the reflecting member 31.

The semiconductor light-emitting element 12 includes a pair of terminals 12*a* electrically connected to an LED chip, and the terminals 12*a* are provided to protrude laterally from the semiconductor light-emitting element 12.

The semiconductor light-emitting element 12 is inserted from the back surface of the reflecting member 31 into an opening part 34 of the reflecting member 31 and is disposed, and the terminals 12*a* of the semiconductor light-emitting element 12 are electrically and thermally connected to and attached to the wiring pattern 45 of the back surface of the reflecting member 31 by soldering or welding.

In the light-emitting device 11 constructed as stated above, since the semiconductor light-emitting element 12 is electrically and thermally connected to the wiring pattern 45 formed on the back surface of the front cover 14, a heat conduction path is formed along which heat generated by the semiconductor light-emitting element 12 is conducted in order of the wiring pattern 45 and the front cover 14, and the heat is radiated from the front surface 14*a* of the front cover 14. Thus, the heat radiation property from the front surface of the light-emitting device 11 can be improved.

Next, a sixth embodiment will be described with reference to FIG. 10 to FIG. 20. Incidentally, the same component as that of the foregoing respective embodiments is denoted by the same reference numeral and its description is omitted.

Figure 10:
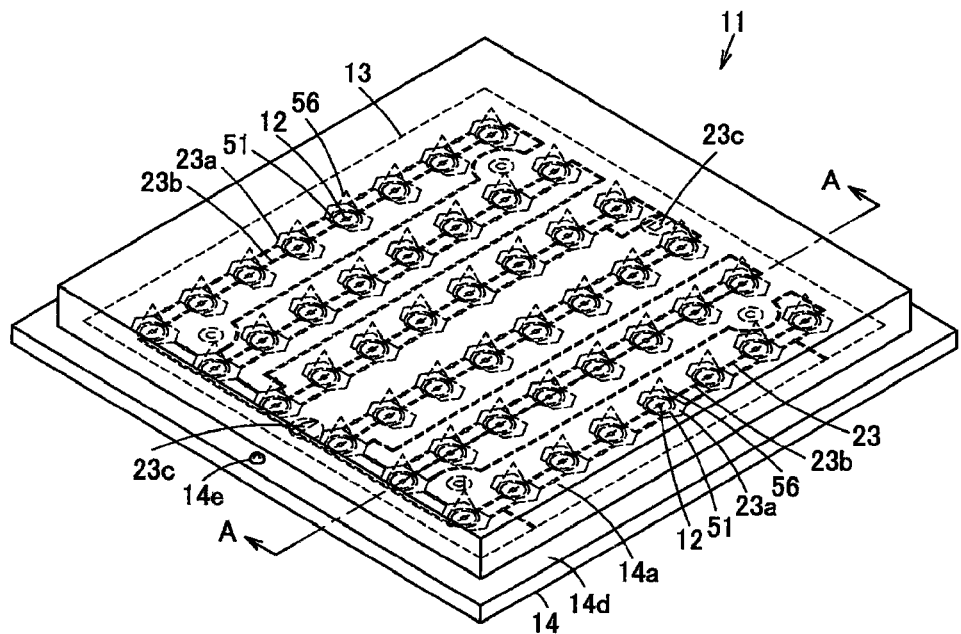
FIG. 10 shows a sixth embodiment and is a perspective view of a light-emitting device.
Figure 11:
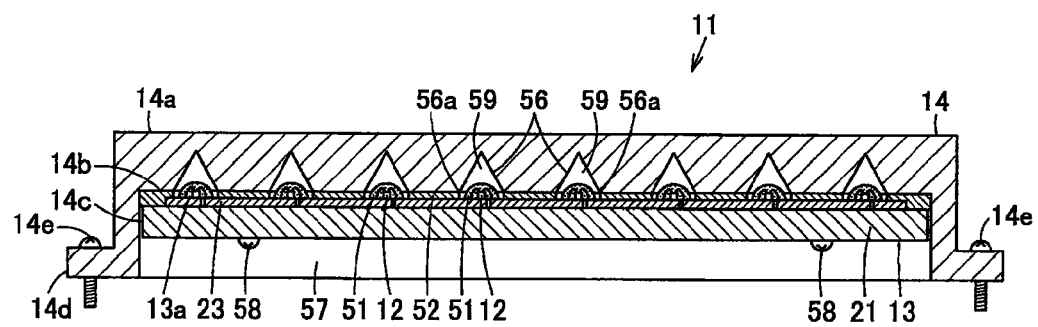
FIG. 11 is a sectional view of the light-emitting device taken along A-A of FIG. 10.
Figure 12:
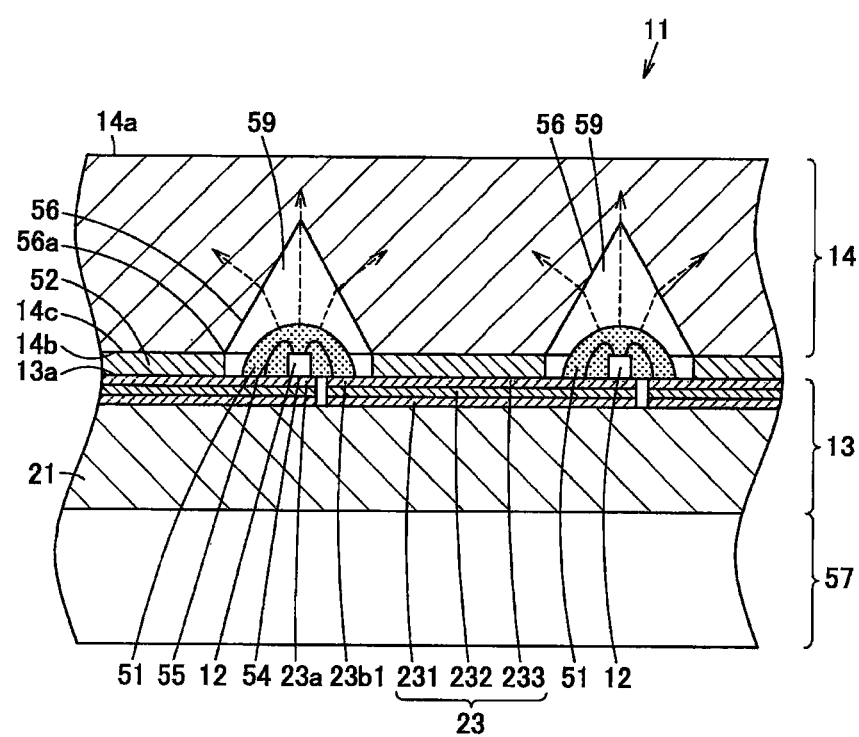
FIG. 12 is a sectional view in which a part of the light-emitting device of FIG. 11 is enlarged.

As shown in FIG. 10 to FIG. 12, a light-emitting device 11 includes plural semiconductor light-emitting elements 12, a substrate 13, phosphor layers 51 to cover the respective semiconductor light-emitting elements 12, a front cover 14 to cover a front surface 13*a* of the substrate 13, and a heat conduction layer 52 intervening between the substrate 13 and the front cover 14.

The substrate 13 is formed into a substantially square shape. The substrate 13 is an insulating member and is formed of glass epoxy resin of synthetic resin material having low heat conductivity. Ceramic material or other synthetic resin material can also be used for the substrate 13. Incidentally, although the substrate 13 is preferably made of a material having low heat conductivity, a material having high heat conductivity, such as aluminum, may be used.

A wiring pattern 23 is formed on the front surface 13*a* of the substrate 13. As shown in FIG. 10 (FIG. 14), the wiring pattern 23 includes substantially hexagonal mounting pads 23*a* on which the respective semiconductor light-emitting elements 12 are disposed, feeding conductors 23*b* having a specific pattern to electrically connect the mounting pads 23*a*, and feeding terminals 23*c*. The plural mounting pads 23*a* are arranged in a matrix so as to be formed in plural lines, and specifically, 8 mounting pads×6 lines, that is, 48 mounting pads in total are formed.

As shown in FIG. 12, the wiring pattern 23 has a three-layer structure, and a copper pattern as a first layer 231 is provided by etching on the front surface of a substrate body 21 of the substrate 13. A second layer 232 is provided on the first layer 231 by electrolytic plating of nickel (Ni), and a third layer 233 is provided on the second layer 232 by electrolytic plating of silver (Ag). The third layer 233 of the wiring pattern 23, that is, the surface layer is plated with silver (Ag), and the total light beam reflectance is as high as 90% or more.

Besides, the semiconductor light-emitting element 12 is made of an LED bare chip. As the LED bare chip, for example, one to emit blue light is used in order to cause a light emitting part to emit white light. The LED bare chip is bonded onto the mounting pad 23*a* by using a silicone resin insulating adhesive 54. The plural semiconductor light-emitting elements 12 are arranged in a matrix so as to be mounted in plural lines, and specifically, 8 elements×6 lines, that is, 48 elements in total are mounted.

The LED bare chip is, for example, an InGaN element, and a light-emitting layer is laminated on a translucent sapphire element substrate. The light-emitting layer is formed by sequentially laminating an n-type nitride semiconductor layer, an InGaN light-emitting layer and a p-type nitride semiconductor layer. An electrode for applying current to the light emitting layer includes a plus side electrode formed of a p-type electrode pad on the p-type nitride semiconductor layer and a minus side electrode formed of an n-type electrode pad on the n-type nitride semiconductor layer. These electrodes are electrically connected onto the wiring pattern 23 by a bonding wire 55. The bonding wire 55 is made of a gold (Au) thin wire, and is connected through a bump containing gold (Au) as its main ingredient in order to improve mounting strength and to reduce damage of the LED bare chip.

Besides, the phosphor layer 51 is made of a translucent synthetic resin, for example, a transparent silicone resin, and contains an appropriate amount of phosphor. The phosphor layer 51 has a conical side shape and is formed in an arc convex shape, and individually covers and seals the semiconductor light-emitting element 12 and the bonding wire 55. The phosphor is excited by light emitted by the semiconductor light-emitting element 12, and emits light of color different from the color of the light emitted by the semiconductor light-emitting element 12. If the semiconductor light-emitting element 12 emits blue light, in order to enable white light to be emitted, a yellow phosphor to emit a yellow light complementary to the blue light is used as the phosphor. The phosphor layer 51 is formed such that the resin in an unhardened state is applied correspondingly to the respective semiconductor light-emitting elements 12 and the bonding wires 55, and then is hardened by heat hardening or by being left for a specified time.

Besides, as shown in FIG. 10 to FIG. 13, the front cover 14 covers the whole area of the front surface 13a of the substrate 13 including the phosphor layer 51, has a translucent property, and is molded into a substantially square dish shape by transparent acryl resin or polycarbonate resin. A receiving recess 14c to receive the substrate 13 is formed on the back surface 14b of the front cover 14, and air layer forming units 56 opposite to the respective semiconductor light-emitting elements 12 and the respective phosphor layers 51 are formed on the back surface of the receiving recess 14c. That is, the plural air layer forming units 56 are arranged in a matrix so as to be formed in plural line, and specifically, 8 units×6 lines, that is, 48 units in total are formed. The respective air layer forming units 56 are formed of conical recesses to receive the respective semiconductor light-emitting elements 12 and the phosphor layers 51, and includes circular opening parts 56a opening on the back surface of the receiving recess 14c. Incidentally, the air layer forming units 56 may be formed of members different from the front cover 14, and the members may be provided on the front cover 14.

A flange 14d protruding outward is formed on a peripheral part of the front cover 14. The flange 14d functions as an attachment part when the light-emitting device 11 is attached to an attachment target part, such as a body of a lighting apparatus or a base, by a screw 14e as a fixing unit.

A heat insulating layer 57 is formed on the back surface of the substrate 13 combined with the front cover 14. The heat insulating layer 57 is constructed to form an air layer between the back surface of the substrate 13 and the attachment target part. That is, a specified interval is provided between the back surface of the substrate 13 and the attachment target part. Specifically, the specified interval is provided between the back surface of the substrate 13 and the attachment target part by the depth size of the receiving recess 14c and an attachment screw 58 to fix the substrate 13 to a specified position, and the heat insulating layer 57 is formed. Accordingly, the receiving recess 14c and the attachment screw 58 constitute a heat insulating layer forming unit. Incidentally, the heat insulating layer 57 is not limited to the air layer, and may be formed by, for example, disposing a heat insulating material in the portion of the air layer.

Besides, as shown in FIG. 11 and FIG. 12, the heat conduction layer 52 is closely provided without a gap between the front surface 13a of the substrate 13 and the back surface 14b of the front cover 14, that is, the back surface of the receiving recess 14c, and is made of a transparent silicone adhesive having adhesiveness. That is, the heat conduction layer 52 functions as an adhesive to fix the substrate 13 to the receiving recess 14c of the front cover 14.

Specifically, the heat conduction layer 52 is provided over substantially the whole area between the front surface 13a of the substrate 13 and the area of the front cover 14 except for the air layer forming unit 56. Accordingly, the substrate 13 is certainly attached to the front cover 14 by the heat conduction layer 52 and the attachment screw 58.

Incidentally, the heat conduction layer 52 is not limited to the silicone adhesive, and an adhesive of another material such as epoxy resin can be used. Further, although the heat conduction layer 52 preferably has the adhesiveness, the adhesiveness is not necessarily required as long as the material is closely provided between the front surface 13a of the substrate 13 and the back surface 14b of the front cover 14 and can made the heat conduction thereof excellent.

As stated above, in the state where the substrate 13 is attached to the front cover 14, conical air layers 59 are formed between the front surface 13a of the substrate 13 and the air layer forming units 56 opposite to the respective semiconductor light-emitting elements 12.

Next, the light-emitting device 11 of the sixth embodiment constructed as stated above, together with the outline of a manufacturing process, will be described with reference to FIG. 13 to FIG. 18.

Figure 13:
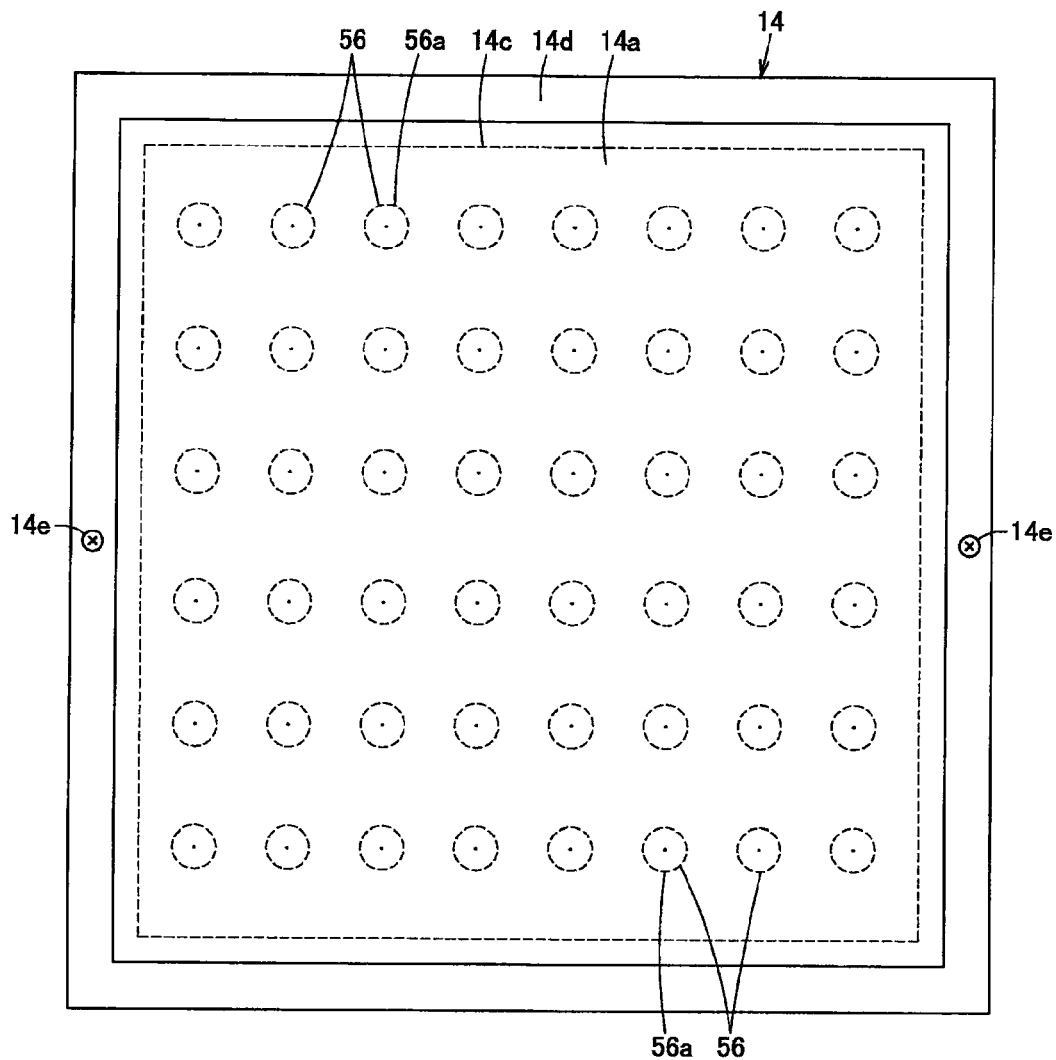
FIG. 13 is a plan view of a front cover of the light-emitting device.

As shown in FIG. 13, the air layer forming units 56 made of conical recesses are arranged in a matrix and are formed on the front cover 14.

Figure 14:
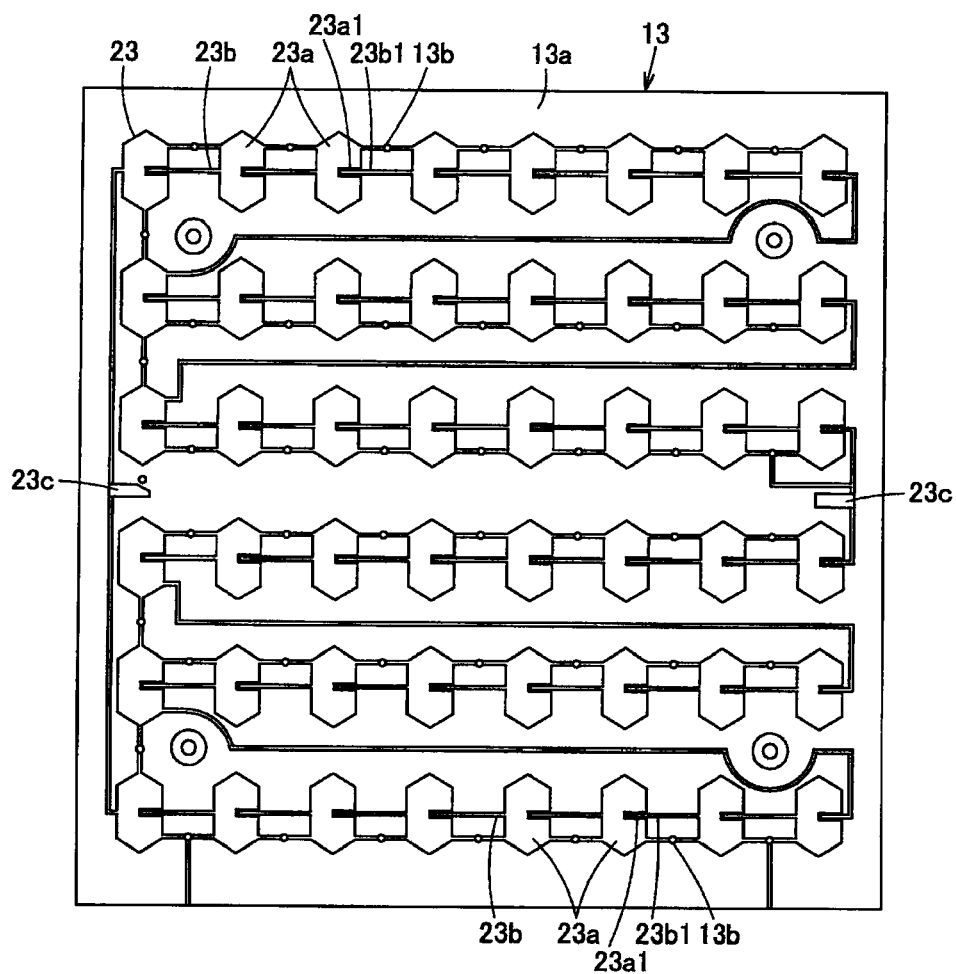
FIG. 14 is a front view showing a wiring pattern of a substrate of the light-emitting device.

As shown in FIG. 14, the wiring pattern 23 is formed on the front surface 13a of the substrate 13. The wiring pattern 23 includes the mounting pads 23a, the feeding conductors 23b, and the feeding terminals 23c. On the side of one side of the hexagonal shape of the mounting pad 23a, a feeding conductor part 23b1 having thin width for bonding wire connection is extended in a direction perpendicular to this side. Besides, on the side of the other side, a cut 23a1 for insulation is formed in which the feeding conductor part 23b1 for bonding wire connection of the adjacent mounting pad 23a enters and is disposed. The feeding conductor part 23b1 for bonding wire connection and the cut 23a1 have such a positional relation that they do not contact with each other, and the feeding conductor part 23b1 and the adjacent mounting pad 23a are in an electrically insulated state. In such positional relation, the plural mounting pads 23a are arranged in a matrix.

The mounting pads 23a are formed on the surface of the substrate 13 in plural lines (6 lines), and the lines are mutually electrically connected by the feeding conductors 23b. Incidentally, although such a state occurs that the adjacent mounting pads 23a are connected by the feeding conductor 23b, a through-hole 13b passing through the substrate 13 is formed in an intermediate part of the feeding conductor 23b, and the feeding conductor 23b is cut with the through-hole 13b, and the adjacent mounting pads 23a are electrically shielded.

The feeding terminals 23c are the feeding terminals at the positive pole and the negative pole, and are connected to the feeding conductors 23b at the right and left both end sides. The feeding terminal 23c is connected with a lead wire by soldering or the like, and power is supplied from a not-shown power supply circuit.

Figure 15:
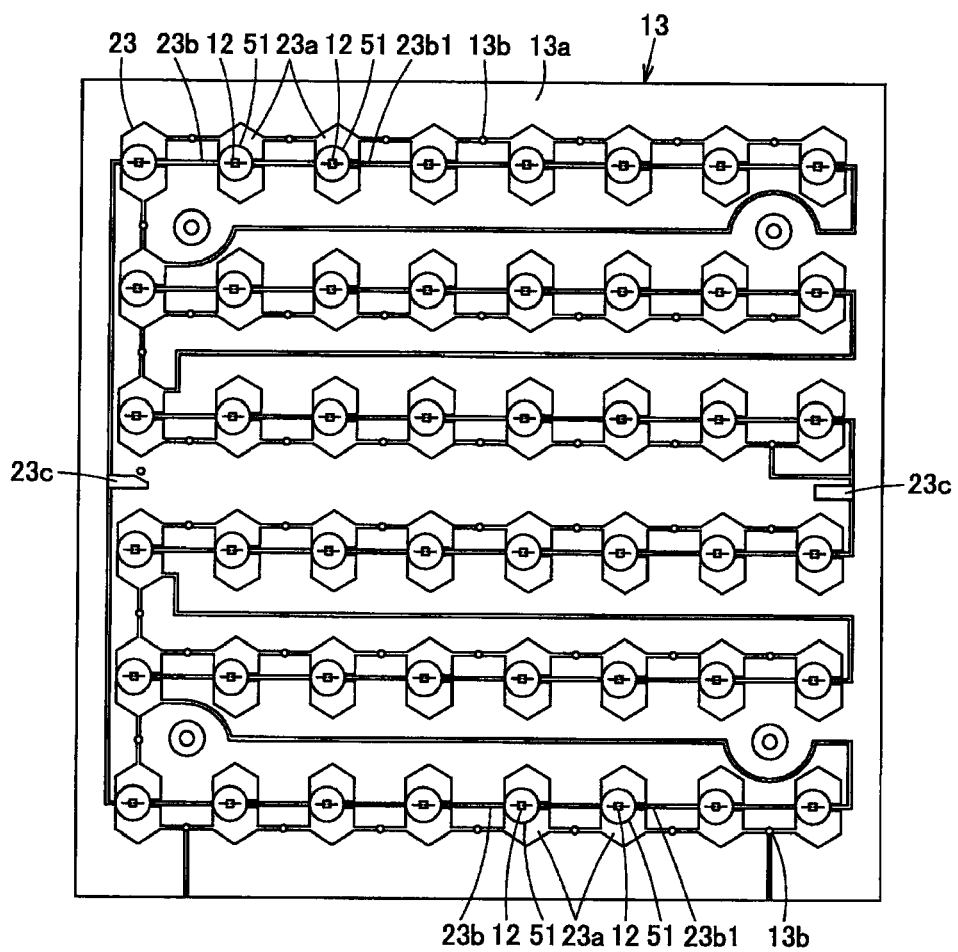
FIG. 15 is a front view showing a state in which light-emitting elements are mounted on the wiring pattern of the substrate of the light-emitting device and phosphor layers are coated.

As shown in FIG. 15, the plural semiconductor light-emitting elements 12 are mounted on the mounting pads 23a of the wiring pattern 23 formed as stated above, and the phosphor layers 51 are formed so as to cover the semiconductor light-emitting elements 12. The plus side electrode and the minus side electrode of each of the semiconductor light-emitting elements 12 are respectively connected to the mounting pad 23a and the feeding conductor part 23b1 of the adjacent mounting pad 23a by the bonding wires 55. Accordingly, two series circuits in which the plural semiconductor light-emitting elements 12 are connected while the feeding terminals 23c at the positive pole side and the negative pole side are connection points, are connected in parallel. That is, in FIG. 15, the semiconductor light-emitting elements 12 of the upper three lines are connected in series, and the semiconductor light-emitting elements 12 of the lower three lines are connected in series, and the two series circuits are connected in parallel to the power supply.

The phosphor layers 51 are applied so as to cover the respective semiconductor light-emitting elements 12 and the bonding wires 55. At this application, the application is performed in an unhardened state, and then, hardening is performed by heat hardening or by being left for a specified time and hardened.

Figure 16:
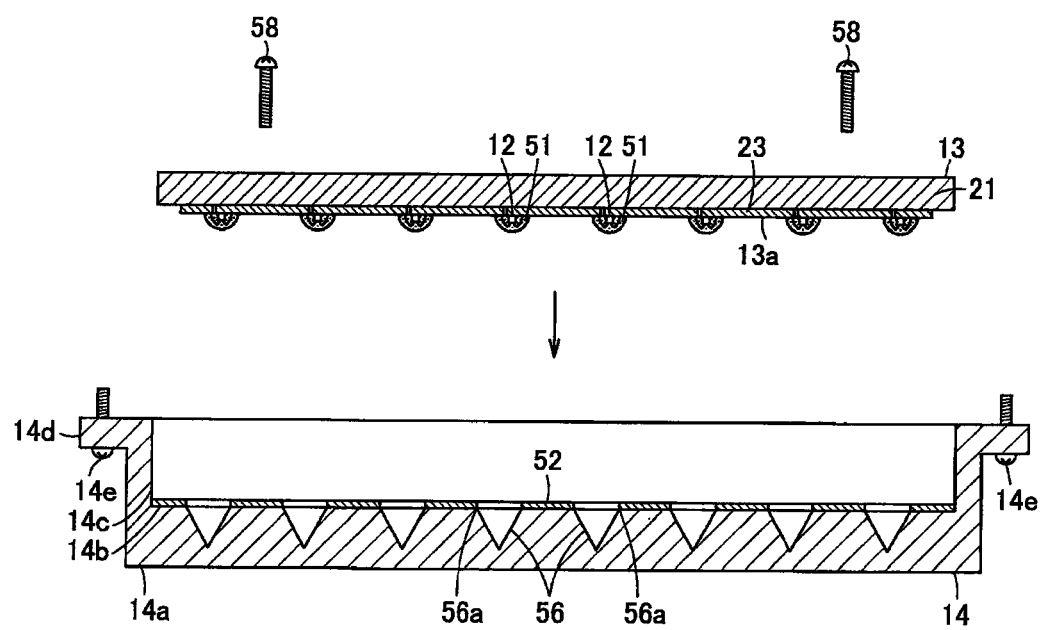
FIG. 16 is a sectional view showing a process in which the substrate of the light-emitting device and the front cover are combined and are bonded by a heat conduction layer.

Next, as shown in FIG. 16, the receiving recess 14c of the front cover 14 is turned upward, and the transparent silicone adhesive which forms the heat conduction layer 52 is applied to the back surface of the receiving recess 14c except for the areas of the opening parts 56a of the air layer forming units 56. Next, the substrate 13 shown in FIG. 15 is disposed in the receiving recess 14c of the front cover 14 from above, and the attachment screw 58 is screwed into the front cover 14 through the substrate 13, so that the substrate 13 is attached to the front cover 14. In the state where the substrate 13 is disposed in the receiving recess 14c of the front cover 14, the heat conduction layer 52 is closely provided without a gap between the front surface 13a of the substrate 13 and the back surface 14b of the front cover 14, and bonds these.

Figure 17:
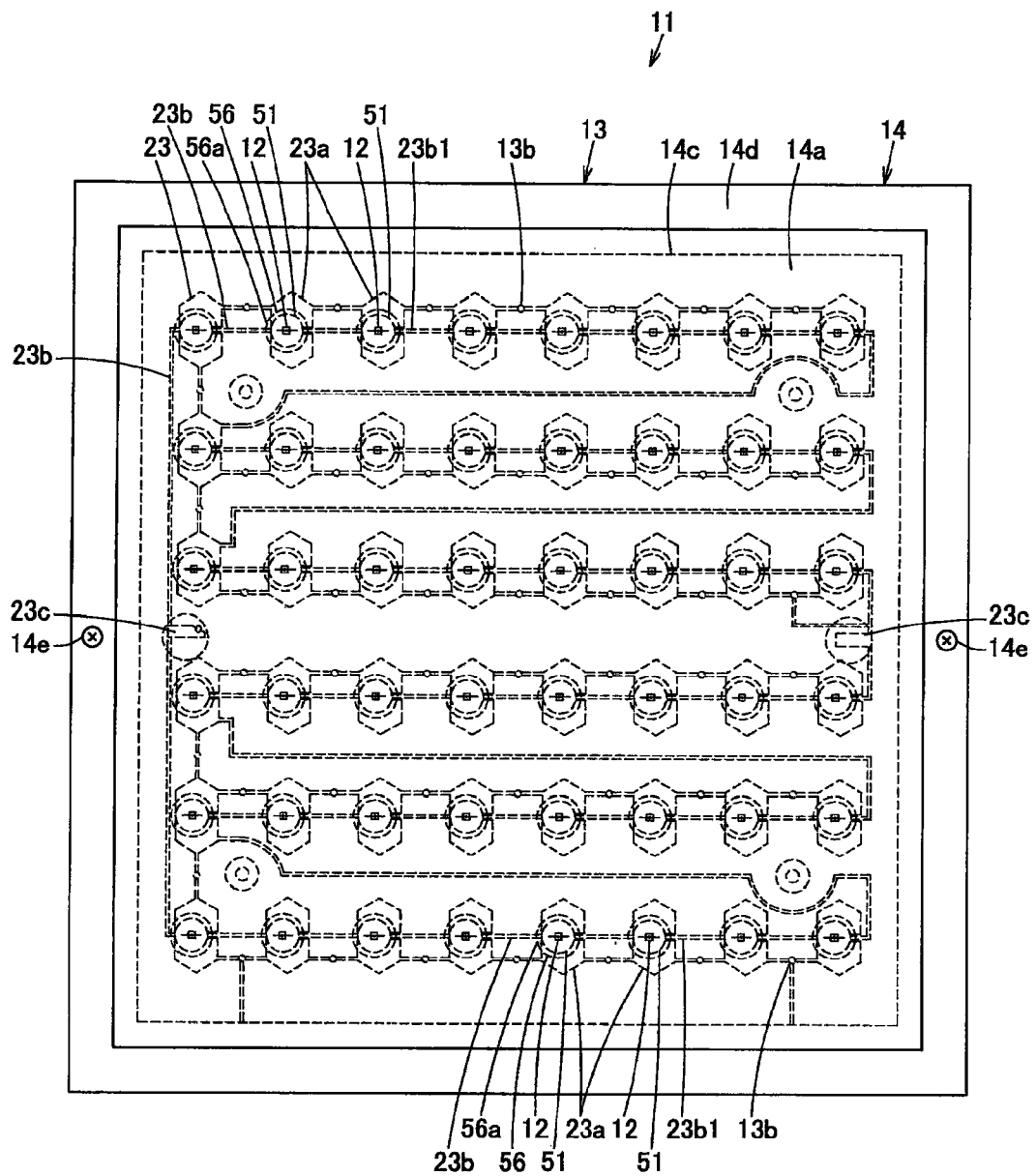
FIG. 17 is a front view showing a state in which the substrate of the light-emitting device and the front cover are combined.
Figure 18:
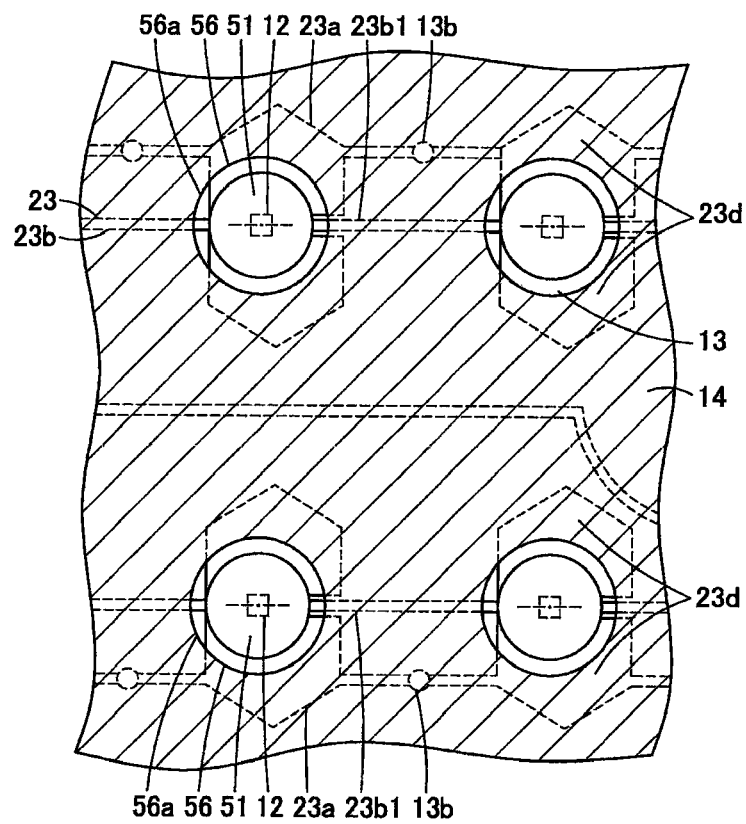
FIG. 18 is a sectional view showing a relation between an opening part of an air layer forming unit and a mounting pad when the light-emitting device is seen from a front direction.

As shown in FIG. 17, when the substrate 13 and the front cover 14 are combined, the respective air layer forming units 56 faces the respective semiconductor light-emitting elements 12 and the phosphor layers 51, and form the air layers 59. In this case, as shown in FIG. 18, although the opening part 56a of the air layer forming unit 56 is formed to be larger than the phosphor layer 51, the opening part is formed to be smaller than the hexagonal mounting pad 23a. In other words, the mounting pad 23a extends to the outside of the area of the opening part 56a of the air layer forming unit 56. Accordingly, the heat conduction layer 52 is applied to an extension part 23d extending from the mounting pad 23a and is disposed to contact therewith. Thus, heat conduction is performed from the mounting pad 23a to the front cover 14 through the heat conduction layer 52.

Figure 19:
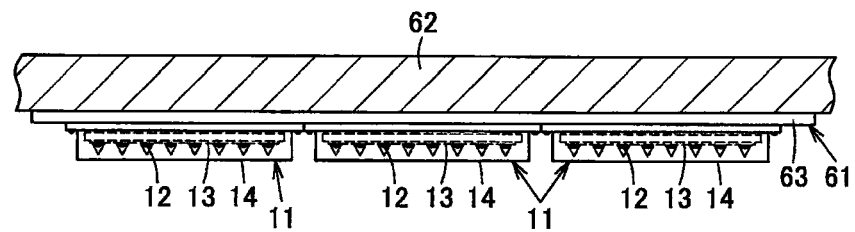
FIG. 19 is a side view of a lighting apparatus using the light-emitting device.
Figure 20:
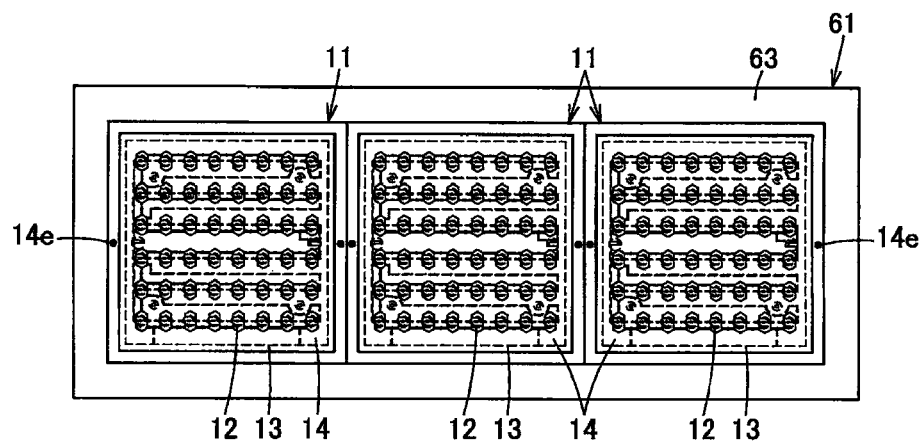
FIG. 20 is a front view in which the lighting apparatus is seen from a light irradiation direction.

Next, a lighting apparatus 61 using the light-emitting device 11 will be described with reference to FIG. 19 and FIG. 20. The lighting apparatus 61 is attached to a ceiling 62 and is used, and includes an apparatus body 63 and plural light-emitting devices 11 disposed on the apparatus body 63. The apparatus body 63 is made of, for example, aluminum, and is formed to be substantially rectangular. The light-emitting devices 11 are fixed to the apparatus body 63 by screwing or the like, while the apparatus body 63 is attached to the ceiling 63 by a fixing unit such as a bolt. Besides, a power supply unit incorporating a not-shown power supply circuit is connected to the light-emitting devices 11. Incidentally, the number of the light-emitting devices 11 is suitably selected and the devices can be disposed.

Next, the operation of the light-emitting device 11 of the sixth embodiment will be described.

When the power supply circuit of the power supply unit supplies power to the respective light-emitting devices 11, the respective semiconductor light-emitting elements 12 of the respective light-emitting devices 11 emit light concurrently, and the respective light-emitting devices 11 are used as planar light sources to emit white light.

During light emission of the semiconductor light-emitting elements 12, the mounting pads 23a function as heat spreaders to diffuse heat generated by the respective semiconductor light-emitting elements 12. Further, during light emission of the semiconductor light-emitting elements 12, light directed to the substrate 13 in the light emitted by the semiconductor light-emitting element 12 is reflected by the surface layer of the mounting pad 23a to the forward direction as the use direction of light mainly.

The air layer forming units 56 are provided to face the respective semiconductor light-emitting elements 12, and the air layers 59 are formed thereby. Thus, as shown in FIG. 12, the light emitted from each of the semiconductor light-emitting elements 12 is diffused at the interface between the air layer 59 and the front cover 14, and is irradiated forward from the front surface 14a of the front cover 14. Accordingly, the brightness of the light irradiated from the front cover 14 of the light-emitting device 11 is uniformed, and uneven brightness can be suppressed, and further, reduction of extraction efficiency of light from the semiconductor light-emitting element 12 can be suppressed.

During light emission of the respective semiconductor light-emitting elements 12, heat is generated from the semiconductor light-emitting elements 12, and the heat is mainly conducted from the semiconductor light-emitting element 12 to the substrate 13, the heat conduction layer 52 and the front cover 14 and is radiated. That is, the heat from the semiconductor light-emitting element 12 is conducted to the front surface of the light-emitting device 11 and is radiated. This is because the heat conduction layer 52 is closely provided between the substrate 13 and the front cover 14, and the heat resistance is reduced. Accordingly, the heat from the semiconductor light-emitting element 12 is conducted to the front cover 14, the heat conduction to the back surface of the substrate 13 is suppressed, and the heat conducted to the ceiling 62 or the like is reduced.

Especially, since the heat conduction layer 52 is disposed to contact the mounting pad 23a, the heat from the semiconductor light-emitting element 12 is efficiently conducted from the mounting pad 23a to the heat conduction layer 52, and further is conducted to the front cover 14 and is radiated.

Besides, since the heat conduction layer 52 has adhesiveness, and is used also as an adhesive between the substrate 13 and the front cover 14, the structure can be simplified. Further, since the substrate 13 and the front cover 14 are bonded by the heat conduction layer 52, dust does not enter between the substrate 13 and the front cover 14, contamination hardly occurs, and water-proof function can also be realized.

Besides, the substrate 13 is formed of a glass epoxy resin having low heat conductivity, and the heat insulating layer 57 is formed on the back surface of the substrate 13. Accordingly, heat conduction to the back surface of the light-emitting device 11 is suppressed, and heat conduction to the front surface of the light-emitting device 11 can be accelerated.

Further, since the light-emitting device 11 includes the front cover 14, a front cover for the lighting apparatus 61 is not required to be provided, and the structure can be simplified.

Besides, the phosphor layers 51 are applied so as to individually cover the respective semiconductor light-emitting elements 12 and the bonding wires 55, the amount of phosphor contained in the phosphor layers 51 can be reduced, and advantage is obtained in cost.

As described above, according to the sixth embodiment, the light-emitting device 11 can be provided in which the heat generated from the semiconductor light-emitting elements 12 can be conducted to the front surface of the light-emitting device 11, the light from the semiconductor light-emitting elements 12 is uniformed, the uneven brightness can be suppressed, and the reduction of extracting efficiency of the light from the semiconductor light-emitting elements 12 can be suppressed, and the lighting apparatus 61 using the light-emitting device 11 can be provided.

Figure 21:
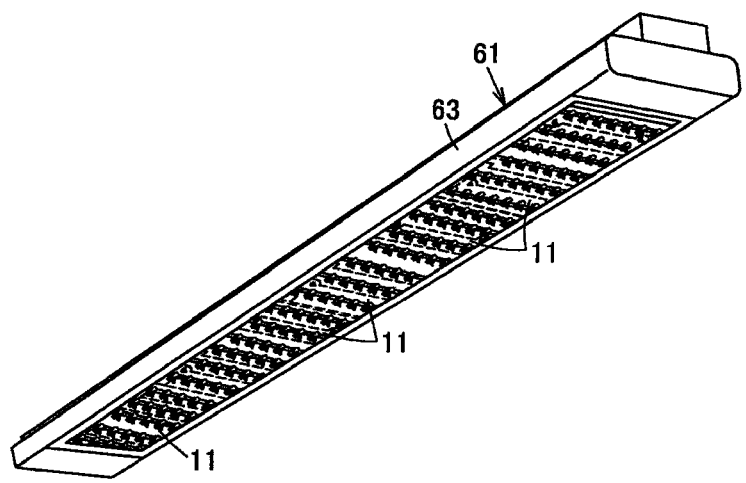
FIG. 21 shows a seventh embodiment and is a perspective view of a lighting apparatus.

Next, a seventh embodiment will be described with reference to FIG. 21. Incidentally, the same component as that of the foregoing respective embodiments is denoted by the same reference numeral, and its description is omitted.

In the embodiment, a lighting apparatus 61 of a ceiling mounting type is described which is installed on a ceiling 62 and is used. The lighting apparatus 61 includes an apparatus body 63 which is thin and long and has a substantially parallelepiped shape, and plural light-emitting devices 11 are linearly disposed in the apparatus body 63. Besides, a power supply unit is incorporated in the apparatus body 63. Incidentally, a front cover for the lighting apparatus 61 is not provided at a lower opening part of the apparatus body 63.

According to this embodiment, the lighting apparatus 61 can be provided in which heat generated from semiconductor light-emitting elements 12 can be conducted to the front surface of the light-emitting device 11, heat conducted to the ceiling 62 can be reduced, and uneven brightness can be suppressed.

Figure 22:
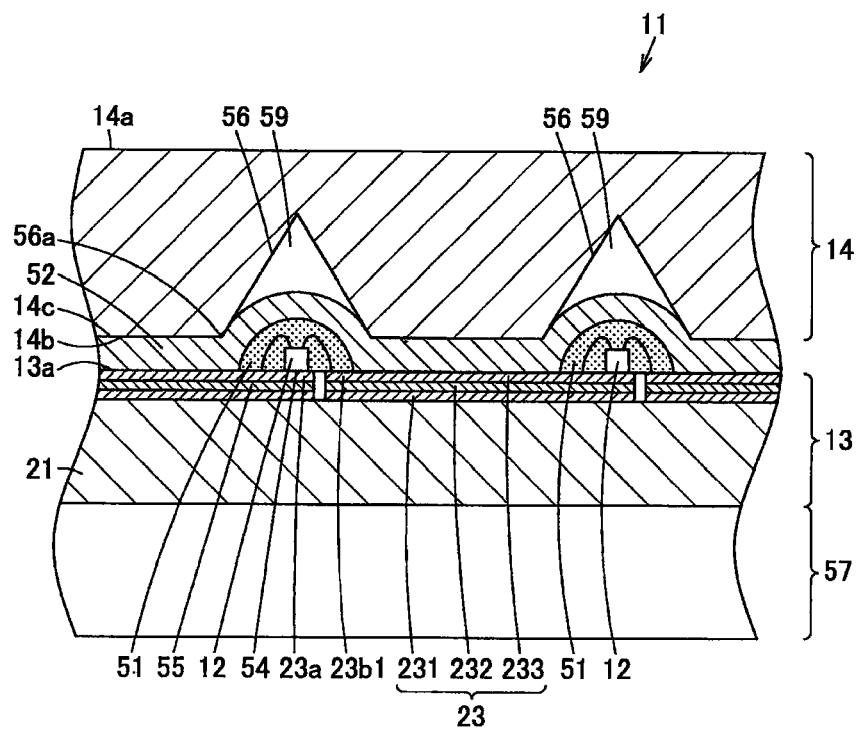
FIG. 22 shows an eighth embodiment and is a sectional view in which a part of a light-emitting device is enlarged.

Next, an eighth embodiment will be described with reference to FIG. 22. Incidentally, the same component as that of the foregoing respective embodiments is denoted by the same reference numeral and its description is omitted.

In this embodiment, a material of transparent silicone resin having specified viscosity and fluidity is used for a heat conduction layer 52. After the transparent silicone resin is applied to substantially the whole area of a front surface 13a of a substrate 13 including respective phosphor layers 51 covering respective semiconductor light-emitting elements 12, the front surface 13a of the substrate 13 is covered with a front cover 14, and a light-emitting device 11 is constructed. Incidentally, although the heat conduction layer 52 preferably has adhesiveness, the adhesiveness is not necessary required as long as heat conduction can be secured.

Also in this embodiment, the same effect as the foregoing respective embodiments can be obtained.

Figure 23:
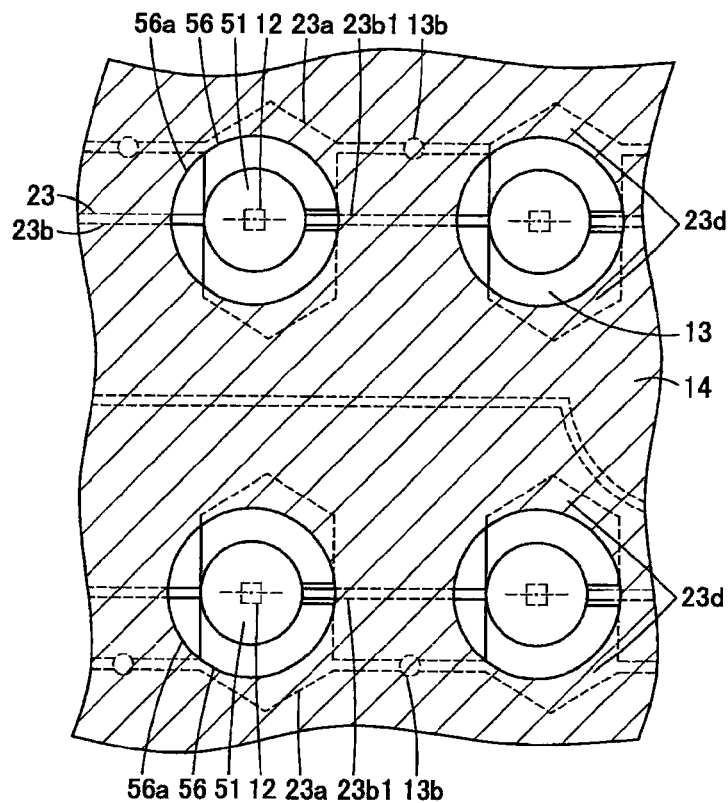
FIG. 23 shows a ninth embodiment and is a sectional view showing a relation between an opening part of an air layer forming unit and a mounting pad, in which a light-emitting device is seen from a front direction.

Next, a ninth embodiment will be described with reference to FIG. 23. Incidentally, the same component as that of the foregoing respective embodiments is denoted by the same reference numeral and its description is omitted.

In this embodiment, a size of an opening part 56a of an air layer forming unit 56 is changed.

That is, the size of the opening part 56a of the air layer forming unit 56 is set to be larger than that in the sixth embodiment (see FIG. 18). By this, since the air layer forming unit 56 becomes large, the diffusion effect of light of a semiconductor light-emitting element 12 can be raised.

Accordingly, by setting the size of the opening part 56a, an adjustment can be made as to whether importance is given to the heat radiation effect of heat generated by the semiconductor light-emitting element 12 or the diffusion effect of light of the semiconductor light-emitting element 12.

Figure 24:
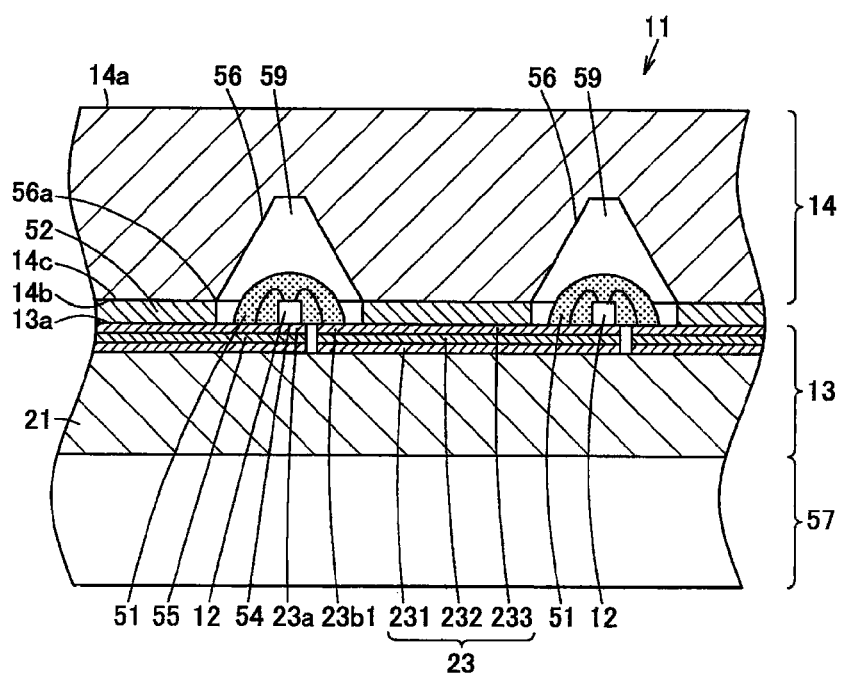
FIG. 24 shows a tenth embodiment and is a sectional view in which a part of a light-emitting device is enlarged.

Next, a tenth embodiment will be described with reference to FIG. 24. Incidentally, the same component as that of the foregoing respective embodiments is denoted by the same reference numeral and its description is omitted.

In this embodiment, the shape of an air layer forming unit 56 is changed and the shape of an air layer 59 is changed.

In this embodiment, the air layer forming unit 56 is formed in a truncated cone shaped recess.

Also when the air layer 59 is formed by the air layer forming unit 56, light from a semiconductor light-emitting element 12 can be diffused and uneven brightness can be suppressed. As stated above, the shape of the air layer forming unit 56 can be suitably selected.

Figure 25:
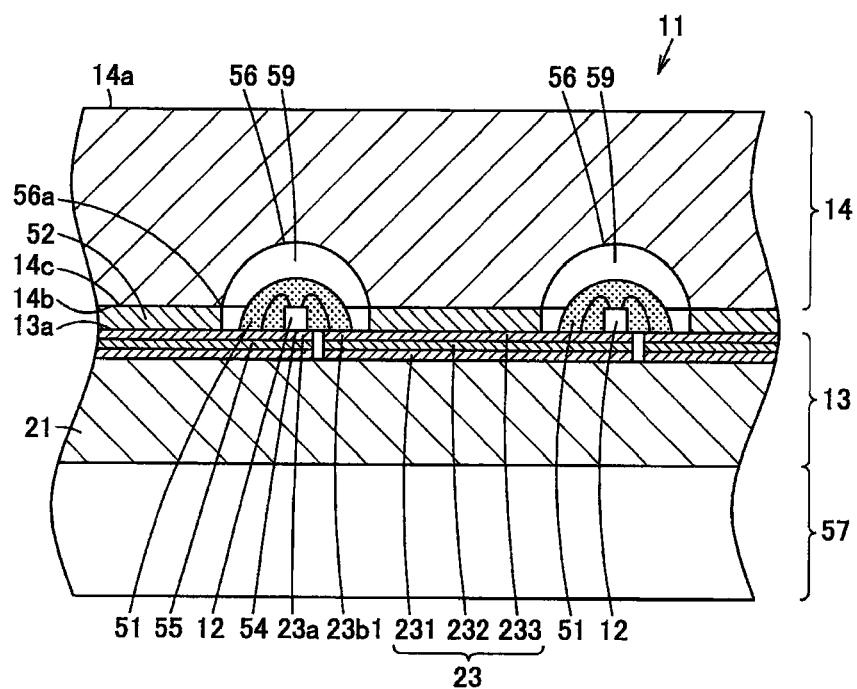
FIG. 25 shows an eleventh embodiment and is a sectional view in which a part of a light-emitting device is enlarged.

Next, an eleventh embodiment will be described with reference to FIG. 25. Incidentally, the same component as that of the foregoing respective embodiments is denoted by the same reference numeral and its description is omitted.

In this embodiment, the shape of an air layer forming unit 56 is changed and the shape of an air layer 59 is changed.

In this embodiment, the air layer forming unit 56 is formed in a dome-shaped recess.

Also when the air layer 59 is formed by the air layer forming unit 56, light from a semiconductor light-emitting element 12 can be diffused, and uneven brightness can be suppressed. As stated above, the shape of the air layer forming unit 56 can be suitably selected.

Figure 26:
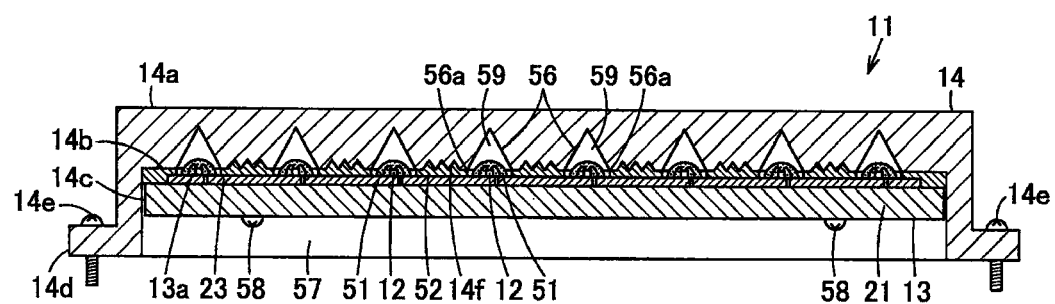
FIG. 26 shows a twelfth embodiment and is a sectional view of a light-emitting device.

Next, a twelfth embodiment will be described with reference to FIG. 26. Incidentally, the same component as that of the foregoing respective embodiments is denoted by the same reference numeral and its description is omitted.

In this embodiment, concave-convex parts 14f are formed on a back surface of a receiving recess 14c of a front cover 14. The concave-convex parts 14f are formed to be positioned between semiconductor light-emitting elements 12.

Accordingly, when light emitted from the semiconductor light-emitting elements 12 and light reflected by mounting pads 23a are irradiated to the concave-convex parts 14f, those lights are diffused and irradiated outward, and in cooperation with the action of an air layer 59, uneven brightness of a light-emitting device 11 can be efficiently suppressed.

Incidentally, the mounting pad 23a may not be used as the wiring pattern 23. That is, if heat conduction is obtained, the mounting pad is not necessarily required to be electrically connected, and there is a case where it is sufficient if function as a heat spreader is provided.

Besides, the air layer forming unit 56 has only to form the air layer 59 for diffusing light emitted from the semiconductor light-emitting element 12, and its shape, size and the like are not limited.

Besides, the heat conduction layer 52 may be provided in the whole area or partially between the front surface 13a of the substrate 13 and the area of the front cover 14 except for the air layer forming unit 56. Besides, "the heat conduction layer disposed so as to contact the mounting pad" means a mode in which heat is conducted from the mounting pad 23a to the heat conduction layer 52.

Besides, the light-emitting part may be constructed such that, for example, phosphor is not used, and the semiconductor light-emitting element 12 directly emits red light, green light or blue light.

A diffusion agent such as alumina or silica may be mixed in the front cover 14 so that the diffusion effect is raised.

As the semiconductor light-emitting element, not only the LED element, but also an EL (Electro Luminescence) element may be used.

The lighting apparatus may be a bulb-type light source, a lighting equipment used outdoor or indoor, a display device or the like.

While certain embodiments of the invention have been described, these embodiments have been presented by way of example only, and are not intended to limit the scope of the invention. The novel embodiments may be embodied in a variety of other forms, and various omissions, substitutions and changes may be made without departing from the gist of the invention. These embodiments and modifications thereof fall within the scope and gist of the invention and within the scope of the invention recited in the claims and their equivalents.

REFERENCE SIGNS LIST

11 Light-emitting device
12 Semiconductor light-emitting element

13 Substrate
13a Front surface
14 Front cover
14b Back surface
23 Wiring pattern
23a Mounting pad
37 Nano-fine particle coating
45 Wiring pattern
52 Heat conduction layer
56 Air layer forming unit
61 Lighting apparatus
63 Apparatus body

The invention claimed is:

1. A light-emitting device comprising:
a substrate including a front surface on which a semiconductor light-emitting element is mounted;
a front cover including:
   a reflecting member including a front surface and a recess in which the semiconductor light-emitting elements are arranged, the reflecting member being formed of a transparent resin having a heat conductivity of 1 to 5 W/mk and a transmittance of 90% or more for light having a wavelength of 400 to 800 nm,
   a translucent member filled only in the recess of the reflecting member, the translucent member being formed of a transparent resin having a heat conductivity of 1 to 5 W/mk and a transmittance of 90% or more for light having a wavelength of 400 to 800 nm, the transparent resin of the translucent member having a different refractive index from the refractive index of the transparent resin of the reflecting member, and
   a translucent cover which covers the front surface of the reflecting member and the translucent member; and
a wiring pattern to which the semiconductor light-emitting element is electrically connected, provided on the front surface of the substrate, wherein:
the front cover thermally contacts the wiring pattern;
there is no air layer between the reflecting member, the translucent member, the translucent cover, or any combination thereof;
the reflecting member is in direct thermal contact with the front surface of the substrate, the translucent member is in direct thermal contact with the front surface of the substrate and the semiconductor light-emitting elements, and the translucent cover is in direct thermal contact with the front surface of the reflecting member and the translucent member;
the wiring pattern provided on the front surface of the substrate includes a mounting pad on which the semiconductor light-emitting element is mounted;
the front cover includes an air layer forming unit that covers the semiconductor light-emitting element and faces the semiconductor light-emitting element; and
the device further comprises a heat conduction layer provided between the front surface of the substrate and an area of the front cover not including the air layer forming unit, wherein the heat conduction layer contacts the mounting pad.

2. The device of claim 1, wherein the heat conduction layer is adhesive.

3. The device of claim 2, further comprising a nano-fine particle coating provided on the front surface of the front cover.

4. A lighting apparatus comprising:
an apparatus body; and
the light-emitting device of claim 2 disposed on the apparatus body.

5. The device of claim 1, further comprising a nano-fine particle coating provided on the front surface of the front cover.

6. A lighting apparatus comprising:
an apparatus body; and
the light-emitting device of claim 5 disposed on the apparatus body.

7. A lighting apparatus comprising:
an apparatus body; and
the light-emitting device of claim 1 disposed on the apparatus body.

* * * * *